(12) United States Patent
Ferguson

(10) Patent No.: US 8,717,080 B2
(45) Date of Patent: May 6, 2014

(54) DIGITAL DELAY LINE DRIVER

(75) Inventor: Paul C. Ferguson, Riverton, UT (US)

(73) Assignee: ADTRAN, Inc., Huntsville, AL (US)

( * ) Notice: Subject to any disclaimer, the term of this patent is extended or adjusted under 35 U.S.C. 154(b) by 756 days.

(21) Appl. No.: 12/247,010

(22) Filed: Oct. 7, 2008

(65) Prior Publication Data

US 2010/0085098 A1 Apr. 8, 2010

(51) Int. Cl.
*H03H 11/26* (2006.01)
*H03K 5/13* (2014.01)

(52) U.S. Cl.
CPC ............................... *H03K 5/133* (2013.01)
USPC ......................................................... 327/261

(58) Field of Classification Search
USPC ......... 327/108–112, 170, 261, 263, 264, 276, 327/277, 278, 281, 284, 285, 288, 389, 391
See application file for complete search history.

(56) References Cited

U.S. PATENT DOCUMENTS

| | | | |
|---|---|---|---|
| 4,949,139 A * | 8/1990 | Korsh et al. ................. 327/391 |
| 5,111,075 A * | 5/1992 | Ferry et al. ....................... 326/27 |
| 5,231,311 A | 7/1993 | Ferry et al. |
| 5,334,891 A * | 8/1994 | Marbot .......................... 327/281 |
| 5,781,050 A | 7/1998 | Russell |
| 6,414,524 B1 * | 7/2002 | Chen .............................. 327/112 |
| 6,452,428 B1 | 9/2002 | Mooney et al. |
| 6,462,688 B1 * | 10/2002 | Sutardja ......................... 341/144 |
| 6,836,168 B1 | 12/2004 | Lesea et al. |
| 6,894,547 B2 * | 5/2005 | Takahashi ..................... 327/170 |
| 6,894,548 B2 * | 5/2005 | Hochschild et al. .......... 327/175 |
| 7,095,258 B2 * | 8/2006 | Deutschmann et al. ...... 327/130 |
| 7,098,704 B2 * | 8/2006 | Ikezaki .......................... 327/112 |
| 7,154,315 B2 * | 12/2006 | Kim ............................... 327/170 |
| 7,392,277 B2 * | 6/2008 | Fletcher ......................... 708/708 |
| 2007/0180185 A1 * | 8/2007 | Hein et al. ..................... 711/100 |
| 2008/0216033 A1 | 9/2008 | Bucossi et al. |

* cited by examiner

*Primary Examiner* — Sibin Chen
(74) *Attorney, Agent, or Firm* — Blakely, Sokoloff, Taylor & Zafman, LLC

(57) ABSTRACT

Improved digital delay line driver is described. A delay line driver circuit includes elements to drive the delay line in one or multiple locations to provide a dynamic, adjustable slew rate on the output signal. The delay line driver circuit may also include active elements coupled to the transistors of the delay line to deactivate the delay line transistors substantially simultaneously, rather than cascading in series. Shutting off the delay line transistors substantially simultaneously reduces or eliminates crowbar or shoot through current on an edge transition of the output signal.

9 Claims, 7 Drawing Sheets

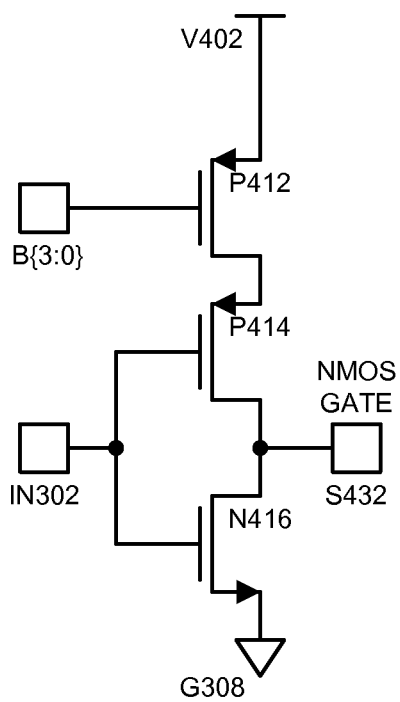 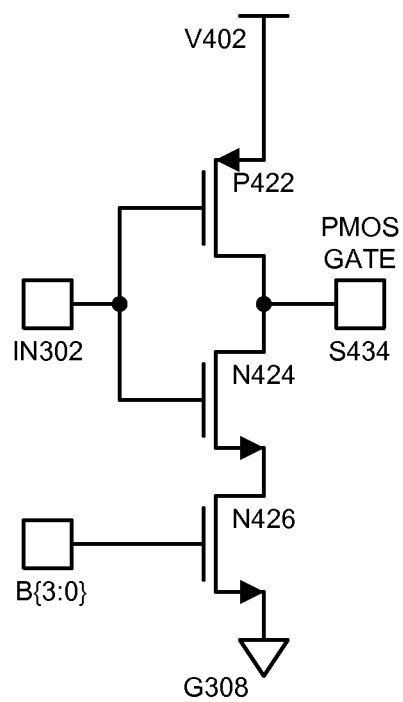
FIG. 4A           FIG. 4B

DIGITAL DELAY LINE DRIVER

FIELD

Embodiments of the invention relate to digital delay line drivers, and more particularly to reducing crowbar current and improving dynamic slew rate control in a digital delay line driver.

BACKGROUND

It is common in circuit designs to have different microchips interconnected via digital interface. The digital interface can cause noise in a circuit. For example, fast transitions or signal edges on a signal transmitted between two microchips over a printed circuit board (PCB) trace between the microchips cause disturbances that may result in crosstalk or electromagnetic interference. The push toward higher-speed circuits increases the exposure to crosstalk and interference problems, seeing that shorter transition times result in greater crosstalk and interference. In addition, short rise times place an extra burden on the PCB layout, as impedance irregularities or stubs are more likely to cause reflections that harm signal integrity. Thus, when designing a digital interface between two microchips, it is often advantageous to have control over the signal transition times on the interface line. Some interface designs have a variable transition time, or slew rate, which allows a designer to use the slowest possible edge speed that satisfies the timing goals of the digital interface.

In addition to the crosstalk and interference discussed above, fast transitions require more transient current from the power supply. The transient current used by a digital driver circuit can be a significant factor in the performance of the interfacing microchips. The inductance of the power supply bond wires and leads combines with the inherent on-chip supply capacitance to create a resonant circuit. Fast rise time in transient supply current, or sharp transient current, can excite the resonant circuit causing ringing on the supply voltages. Such ringing in turn couples into the substrate of the microchip, which can interfere with circuitry throughout the chip. Digital line drivers often have the sharpest current transients of any circuit on a microchip, often with the highest magnitude transient, meaning the digital line driver may be responsible for significant overall microchip noise.

Transient currents with large peak amplitudes (large di/dt) may also cause problems with power supply droop, which results when the current travels through the finite resistance of the supply wires/traces throughout the microchip. As a result, supply voltage at various locations along the supply wires/traces may be lower than at the source. Observe that the power supply will also have an inherent inductance, L, which will result in an increased voltage drop with large di/dt, due to the known relationship with voltage and Ldi/dt.

Most common digital drivers are similar or the same layout as a CMOS (complimentary metal-oxide-semiconductor) inverter. A large PMOS (positively-doped metal-oxide-semiconductor, or p-type) transistor pulls up the line voltage during a rising edge, and a large NMOS (negatively-doped metal-oxide-semiconductor, or n-type) transistor pulls down the line voltage during a falling edge. The advantages to such a digital driver is that it is simple, small (very efficient in use of die area), and can handle high switching speeds. However, there are several disadvantages to the inverter design. Although the circuit is generally fast, the edge speed is very sensitive to variations in temperature, power supply voltage, and manufacturing parameters. Transition times may exhibit a four to one or even five to one variation. Thus, the inverter design results in timing uncertainty and potentially very high di/dt and peak currents.

One known approach to reducing di/dt in the power supply is with a series of output transistors, rather than a simple inverter design. Such an approach is illustrated by circuit 100 of FIG. 1. FIG. 1 is a representation of a prior art digital delay line driver. Circuit 100 has a more gradual turn on of the output than the simple inverter design. Input IN 106 is passed to the gates of each of the series transistors. P112, P114, P116, and P118 are PMOS transistors to pull up output line OUT 108 on a rising edge to voltage source V102, and N122, N124, N126, and N128 are NMOS transistors to pull down OUT 108 on a falling edge to ground/reference G104. Resistors R132, R134, R136, and R138 are in the gates of transistors P112, P114, P116, and P118, respectively, while resistors R142, R144, R146, and R148 are in the gates of transistors N122, N124, N126, and N128, respectively. The resistors before each gate combine with the capacitance of the gate to form an RC delay line. The voltage drop across each successive series resistor causes a delay in the gate voltage of each successive transistor from reaching an active state. Thus, each gate turns on one at a time, resulting in an overall output current that is much more gradual than turning on the transistors all at the same time (essentially eliminating the resistors in the gates of the transistors). The slew rate of circuit 100 is slower than the simple inverter design. Note that for purposes of simplicity in description, each of the digital line drivers shown in the Figures is illustrated with four transistors. The teachings herein could be applied equally well to a digital delay line driver having multiple transistors of a number more or fewer than four.

One significant disadvantage of circuit 100 is that the turn off of the transistors will occur in a staggered fashion, just as the turn on is staggered. The staggering of the turn off of the transistors results in "crowbar" or "shoot through" current (referred to herein as crowbar current). Crowbar current occurs during the transition of the output signal, for example, when the first pull down transistors (e.g., N122) is conducting prior to the turn off of the last pull up transistors (e.g., P118). The reverse also results in crowbar current, for example, when P112 turns on prior to the turn off of N128. When both pull up and pull down transistors are simultaneously conducting, there is a low impedance path created between power and ground, allowing large currents to flow from power to ground. Simultaneous conduction of the pull up and pull down circuit elements not only wastes power, but also causes a large supply droop and ground bounce.

Thus, there are significant performance disadvantages to both the simple inverter design digital line driver, as well as a conventional digital delay line driver. The disadvantages discussed above result in power inefficiency and noise in the microchip. The disadvantages are increasingly significant in higher-speed microchips.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

FIGS. 4A and 4B are representations of inverters with tristate pull up or pull down.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DETAILED DESCRIPTION

A digital line driver is described having improved performance over known delay-line drivers. The digital line driver design described includes circuitry to control the di/dt of the supply current, which results in less ground bounce as compared to traditional circuits, and circuitry to reduce crowbar current (see, for example, FIG. 2 below). The digital line driver also includes circuitry to allow control of the output slew rate (see, for example, FIG. 3 below).

Figure 1:
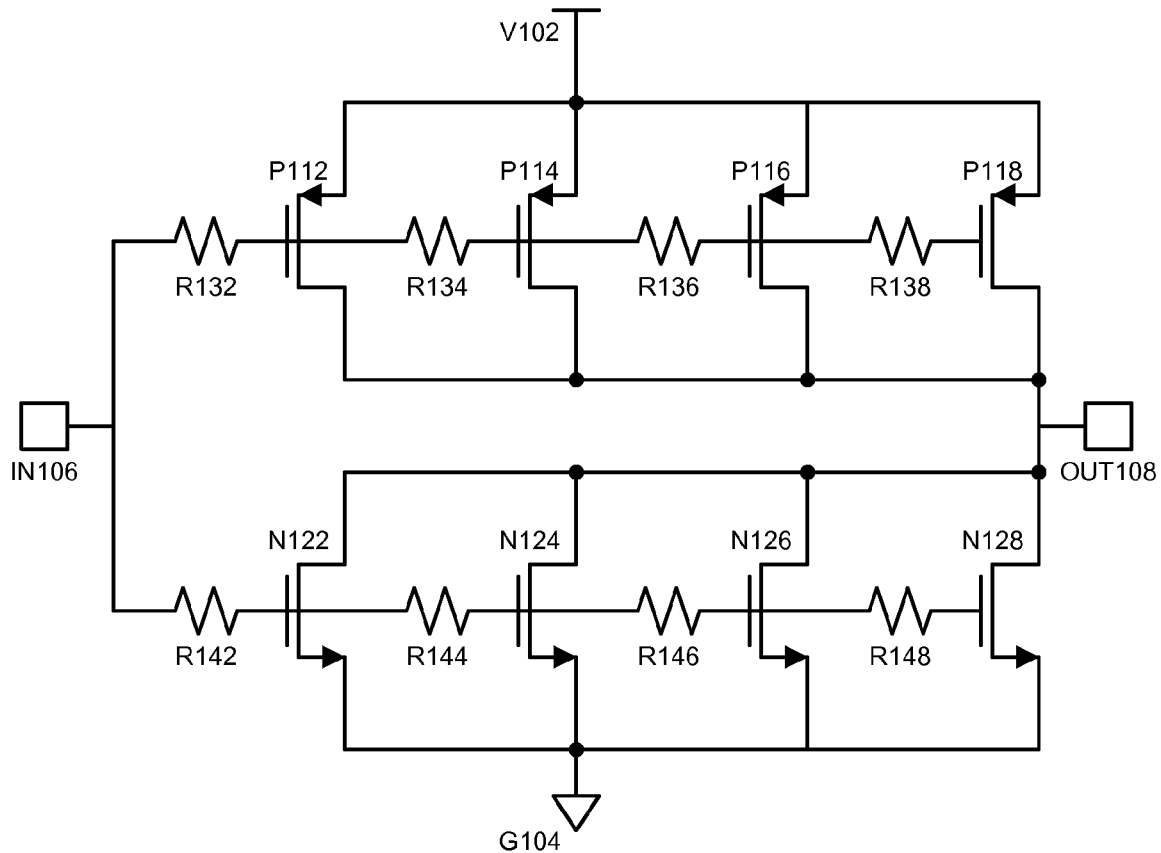
FIG. 1 is a representation of a prior art digital delay line driver.

As mentioned above, the traditional delay line driver (as depicted in FIG. 1) suffers from high crowbar current because the delay line slows down both the turn on and the turn off of the elements. As a result, there will be a time in a transition from a logic high level to a logic low level, or the reverse, where both the pull up and pull down transistors are turned on. The crowbar current can be controlled by providing an active element at the gate of each output line transistor to simultaneously turn off the output line transistors. Thus, an RC delay line is used to stagger the turn-on of the output line transistors, and the output line transistors are turned off together to prevent the transistors from being turned at the same time as the output line transistors that control the other logic output (e.g., prevent the NMOS transistors from being turned on when the PMOS turn on, or vice versa). The active devices connected to the gates do not affect the slew rate of the output current given that the active devices are not activated until the driver output is already saturated and the output current should be zero.

The slew rate control can be accomplished by having control bits and accompanying control circuitry that will selectively drive the output transistors. Thus, the slew rate can be doubled, for example, by driving both ends of the delay line simultaneously, instead of only driving one end. Additionally, the slew rate can be increased by driving the middle of the delay line, or driving multiple points (e.g., driving the both ends and the middle). Driving multiple points in the delay line activates multiple transistors in the delay at the same time, increasing the output current. The increase in the output current increasing the transition slope of the output signal, causing a faster transition. A slower transition can be achieved by driving fewer transistors in the delay line. The control is dynamic and variable by virtue of the control bits and control circuitry that controls where the delay line is driven. The different possible ways to drive the delay line are implementation specific, but in general will be affected by the number and placement of the control lines, as well as the value of the gate resistors in the delay line. The delay line may be driven at one or more points in the delay line, such as the beginning, end, or the middle of the delay line, or a combination of points in the delay line. Again, examples are provided below (see FIG. 3 and FIG. 5).

Thus, the digital delay line driver as described herein has controlled slew rate, similar to the known delay line driver of FIG. 1, but also provides a variable slew rate, greatly reduced crowbar current, and improved performance in power supply droop. The improved performance of the digital delay line driver described herein allows the driver to be used on a mixed-signal chip with minimal impact to sensitive analog circuits.

Figure 2:
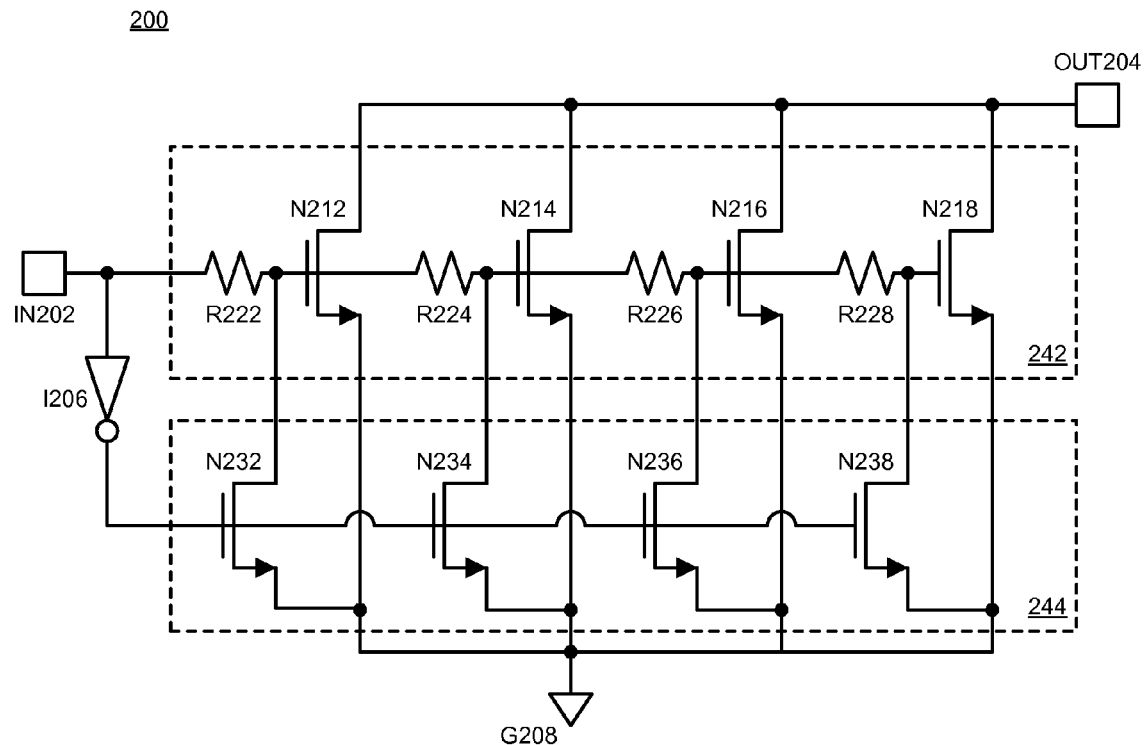
FIG. 2 is a representation of a digital delay line driver having crowbar current control.

FIG. 2 is a representation of a digital delay line driver having crowbar current control. Circuit 200 receives digital input IN202, and generates output OUT204 based on IN202. As will be understood, IN202 is generally a low power signal as compared to the power needed to drive the output line of OUT204. Note that the transistors illustrated are n-type field effect transistors (FETs). The FETs could be, for example, MOSFETs or JFETs (junction field effect transistors). It will be understood that while described in reference to FETs, the transistors could be bipolar junction transistors (BJTs), or another type of transistor. It will be appreciated that a BJT has a base current that should be accounted for in design, whereas gate current on a MOSFET is negligible. One possible design consideration may be to vary the resistor size in the bases of the transistors in a BJT delay line to adjust for the base current. Other modifications may be understood by those skilled in the art.

Additionally, for purposes of simplicity and ease of description, MOSFET circuits are described, while other transistor types could be used. Thus, throughout the remainder of this Description and the Claims, reference to transistors is specifically described with reference to MOSFETs, while other transistor types could be substituted. Additionally, for simplicity in terminology, transistors are described as having a control terminal, an output terminal, and a reference terminal. The control terminal refers to the terminal with which the transistor is activated, such as a FET gate or a BJT base. The output terminal refers specifically to the terminal on which the output is generally driven, such as the FET drain or the BJT collector. The reference terminal refers to the source of the charge carriers, such as the FET source or a BJT emitter.

Note that circuit 200 only illustrates the NMOS transistors of the digital delay line driver. Thus, circuit 200 is useful to pull down OUT204; there will be a complimentary portion of a complete digital delay line driver with PMOS transistors (not shown). The techniques shown here are equally effective for a PMOS series of output transistors. In one embodiment, the transistors are field effect transistors (FETs).

Delay line 242 is a series of output transistors that are part of a digital delay line driver. Elements 244 are active elements coupled to the gates of the individual resistors of delay line 242. Elements 244 pull down the gates of the transistors of delay line 242 when input IN202 transitions from a high logic value to a low logic value. The pulling down of the gates of the transistors of delay line 242 will turn off all the transistors at substantially the same time. Note that the active elements are likely, technically, to turn on in a slightly cascading fashion, and thus turn off the gates of the transistors delay line 242 in a slightly cascading fashion. However, the resistors, R222, R224, R226, and R228 in the gates of the transistors delay line 242 and the lack of resistors at the gates of elements 244 will cause the turn off of delay line 242 (even assuming a slight staggering) from a falling edge to occur orders of magnitude faster than the turn on of delay line 242 on the rising edge. It will be understood that additional capacitance (either through process variation or through the addition of circuit components) may be added to the gates of the transistors to adjust the response time of the transistors.

Thus, reviewing operation of circuit 200, on the rising edge, input IN202 will generate a logic high, which will cause delay line 242 (having individual elements N212, N214, N216, and N218) to turn on. The turn on of delay line 242 will be staggered or cascaded, as there is a resistor (R222, R224, R226, and R228, respectively) at the gate of each output transistor N212, N214, N216, and N218. The resistors cause a delay in the turn on of delay line 242. The delay can be designed to a particular rate based on the value of the transistors (with higher values corresponding to greater delay). On the rising edge corresponding to a logic high, inverter I206 will generate a logic low output, causing elements 244 to be turned off, by driving the gates low. Thus, elements 244 will be off, and delay line 242 will drive (pull down to ground G208) output line OUT204.

On the falling edge, circuit 200 should no longer pull down output OUT204, and thus, delay line 242 should be turned off. Inverter I206 will generate a logic high, resulting in the turning on of elements 244 (with individual NMOS transistors N232, N234, N236, and N238 coupled between ground and the gates of N212, N214, N216, and N218, respectively). Each of N232, N234, N236, and N238 will pull down the gate of its corresponding output transistor N212, N214, N216, and N218. Thus, the transistors of delay line 242 will be shut off substantially simultaneously.

In a similar circuit for a pull up branch of an output driver, the output series transistors would be PMOS, as would the active elements coupled to their gates. The operation would work in reverse, with a rising edge causing active element turn on and output transistor turn off.

Figure 3:
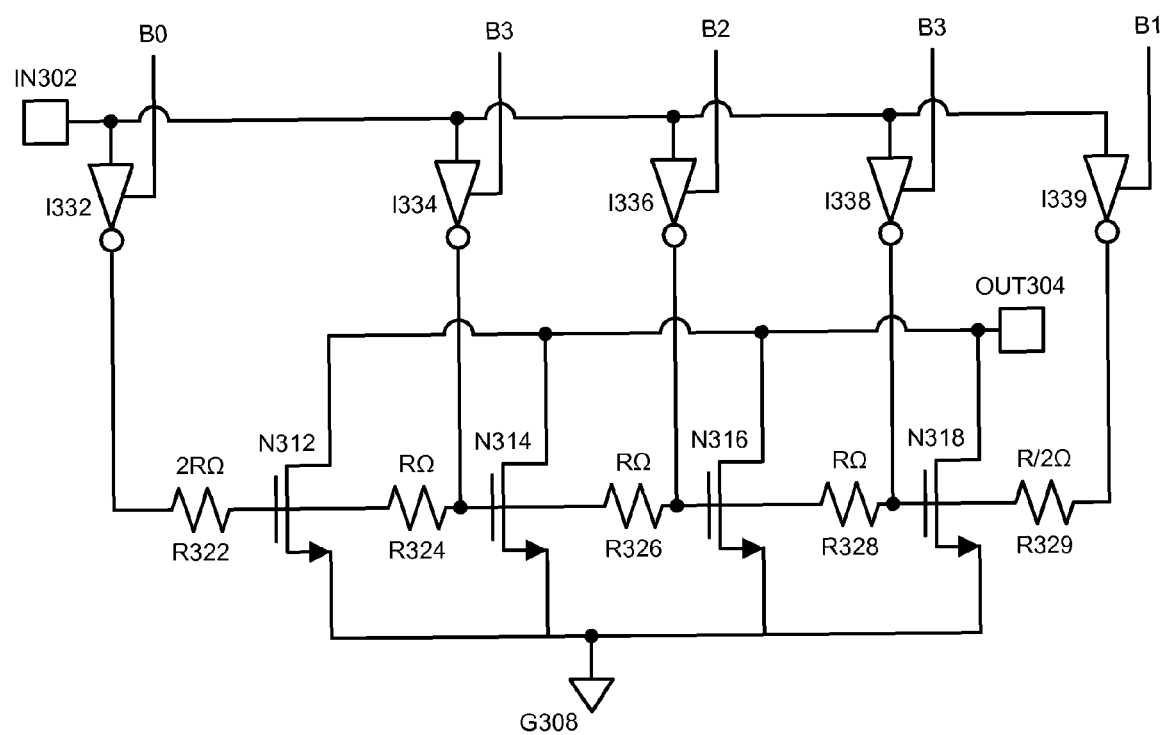
FIG. 3 is a representation of a digital delay line driver having dynamic, variable slew rate control.

FIG. 3 is a representation of a digital delay line driver having dynamic, variable slew rate control. Circuit 300 represents a pull down circuit for a digital line driver. Circuit 300 could be combined with circuit 200 of FIG. 2, as shown below in FIG. 5; however, both circuits could also be used independently of each other. As with the description of circuit 200 of FIG. 2, circuit 300 would generally be used with a complimentary pull up branch (not shown) of a digital line driver. The techniques for circuit 300 would apply equally well to a complimentary PMOS pull up circuit.

In circuit 300 active elements represented by inverters I332, I334, I336, I338, and I339 are coupled to the gates of output transistors N312, N314, N316, and N318. Observe that inverters I332 and I339 are coupled to the first and last transistors, respectively, of the series of output transistors, while I334, I336, and I338 are coupled to two gates, as is discussed in more detail of the operation of circuit 300 below. The active elements may also be referred to as control logic, which drives the control terminal of a transistor of a delay line.

Input IN302 is indirectly coupled to the output transistors N312, N314, N316, and N318, through inverters I332, I334, I336, I338, and I339, or equivalent control logic. Inverters I332, I334, I336, I338, and I339 provide four bits of resolution in slew rate control. Based on the value of IN302, and which control bits (B[3:0]) are set, output transistors N312, N314, N316, and N318 will turn on and generate the output. It is assumed that at least one control bit will be set, thus activating at least one inverter, whenever IN302 has a logic high value, which causes the output transistors to turn on and pull OUT304 low. However, the combination of which control bits are set, and thus which inverters are activated, will determine how quickly the output transistors turn on, and how quickly OUT304 is pulled low.

The value of the gate resistors, R322, R324, R326, R328, and R329 will affect the turn on speed of the output transistors in addition to which inverters are activated. Thus, circuit 300 can be configured to drive output OUT304 with various different slew rates, depending on the resistor values and the control bit combinations. In one embodiment, values may be selected to provide binary steps (powers of two) in the slew rate, or linear (single unit changes) for different combinations of control bits. One example is illustrated that has resistor R322 of value 2R Ω coupled between inverter I332 controlled by control bit B0 to the first output transistor in the series, N312. Inverter I339 controlled by control bit B1 is coupled to the gate of the last transistors in the series, N318, through R329 having a value of R/2Ω. There are also resistors R324, R326, and R328 of value R Ω coupling the gate of transistor N312 to the gate of N314, the gate of N314 to the gate of N316, and the gate of N316 to the gate of N318. Inverter I336 controlled by control bit B2 is coupled directly to the gate of N316, and through resistor R326 to the gate of N314, and through resistor R328 to the gate of N318. Inverters I334 and I338 are both controlled by control bit B3, with inverter I334 directly coupled to the gate of N314, and I338 directly coupled to the gate of N318.

Operation of circuit 300 is described as follows. With specific reference to circuit 300, the "delay line" refers to the series of output transistors N312, N314, N316, and N318. When inverter I332 is enabled by control bit B0, and all other inverters are disabled, I332 drives one end of the delay line (starting with N312 as illustrated) through resistor R322 of value 2R Ω, which results in the slowest slew rate that is possible for the configuration of the circuit 300. If I332 is disabled and I339 is enabled by control bit B1, the delay line is driven through the other end of the series (starting with N318 as illustrated) resistor R329 of value R/2Ω, which charges the delay line faster than driving it through R322. Thus, a control code of 0010 has a faster slew rate than 0001. If both I332 and I339 are activated (control code 0011), the delay line will be driven at both ends, through resistors R322 and R329 of values R/2Ω and 2R Ω, respectively, which will activate the delay line faster than a control code of either 0001 or 0010. However, the delay line may be activated still faster by activating I336 with control bit B2, which charges the control line in the middle. Note that when control bit is activated, transistor N316 will be driven directly (not through a resistor), while also driving N314 and N318 through resistors R326 and R328, respectively, both of value R Ω. Activating control bit B3 activates both I334 and I338, directly driving N314 and N318, respectively (not through resistors), which driving the other output transistors through resistors of value R Ω.

Note that the delay line may include more output transistors than is shown. There is no requirement that the number of control bits be equal to the number of output transistors. Thus, while circuit 300 has four output transistors and four control bits, there could be six or eight (or more) output transistors with four control bits, or any other combination. Likewise, circuit 300 could be implemented, for example, by two or three control bits instead of four. The implementation is dependent upon the configuration desired by the designer, but the principle of operation will be similar.

Observe that circuit 300 could be driven at a single point in the delay line, or could be driven at multiple points in the delay line by adjustments to the control circuitry. It will be understood that such adjustments could refer to adjustments to the circuit as illustrated (e.g., triggering B0 drives the circuit at the front or beginning of the delay line, while triggering B1 drives the delay line from the end, and triggering B3 drives multiple points of the delay line simultaneously), as well as adjustments to the circuit illustrated to produce a circuit that modifies the functionality illustrated in circuit 300.

Observe also that the output impedance changes with the slew rate. Fast transitions with high currents correspond to low output impedances as seen at OUT304. Slower transitions are achieved by activating fewer devices simultaneously, corresponding to a higher output impedance. The variable slew rate control thus provides a user with flexibility in matching transmission line impedance, resulting in improved power efficiency. Circuit 300 could also be designed (e.g., by controlling the transistor sizes and impedances of the gate resistors) to have a very low (relative) output impedance even at the slower slew rate settings, which enables source impedance to be controlled with an external resistor (not shown). Such an external resistor would be on output line OUT304, generally located external to a microchip circuit of which circuit 300 is a part.

While circuit 300 focuses on an NMOS implementation of a pull down section of a digital line driver, a PMOS pull up section of the driver would be implemented in a similar manner.

FIGS. 4A and 4B are representations of inverters with tristate pull up or pull down. As discussed above with respect to FIG. 3, inverters can be used to implement a variable slew-rate delay line driver. Additionally, tristate inverters 410 and 420 can implement the crowbar current control as illustrated in FIG. 2. Tristate inverters 410 and 420 illustrate examples of tristate inverters that could be used in circuit 300 and a complimentary counterpart (pull up) circuit. An efficient tristate inverter design can provide important performance efficiency of the entire delay line driver. Referring to circuit 300, note that all output transistors of the delay line will be pulled down before every rising edge. The desired slew rate determines which output transistors will be activated directly, and which will be activated in a staggered fashion by the operation of the delay line. Rather than using a tristate inverter to drive the various points on the delay line, it is only necessary to use a tristate pull up with a two state pull down. FIG. 4A illustrates a tristate pull up (inverter 410) for use with an NMOS pull down section of a digital delay line driver (such as circuit 300 of FIG. 3). FIG. 4B illustrates a tristate pull down (inverter 420) for use with a PMOS pull down section of a digital delay line driver (see FIG. 5). The tristate inverters can be considered "active elements" coupled to the gates of the delay line transistors.

Inverters 410 and 420 drive various points of their respective delay line sections. One note is that PMOS transistors will generally have a lower transconductance and corresponding larger size, meaning the resistors at the gates of the PMOS output transistors will should be sized smaller than corresponding resistors at the gates of the NMOS output transistors to achieve similar performance in the slew rate control of the pull up and pull down sections of the delay line driver.

Inverter 410 includes PMOS transistor P412 having the source coupled to the reference voltage V402, and the input signal (one bit of B {3:0}) driving the gate. The drain of P412 is coupled to the source of PMOS transistor P414. The drain of P414 is coupled to the drain of NMOS transistor N416, which in turn is coupled via its source to ground G308.

Transistors P414 and N416, driven by the input, IN302, can be considered the "inverter portion" of inverter 410, while transistor P412 can be considered the "tristate portion" of inverter 410. The inverter portion inverts the received input, while the tristate portion enables and disables the inverter, or puts inverter 410 in a high impedance (high-z) state. The output of inverter 410, S432 to the gate of an associated NMOS delay line transistor, is generated at the node coupling the drain of N416 to the drain of P414. The gates of both N416 and P414 are driven by the input, IN302. By having the control bit (B{3:0}) control P412, whenever the control bit is a logic low, inverter 410 will be activated by turning on P412 (by pulling the gate low). Thus, whatever signal is present on IN302 (discussed in more detail below) is inverted and output at output S432. When the control bit is a logic high, P412 is deactivated. If IN302 is a logic low, then N416 is deactivated. In this case, there is no low impedance path to supply V402 or G308, and output S432 is in a high impedance state. The high impedance state allows normal operation of the delay line. However, if IN302 is a logic high, then N416 is turned on, and output S432 is pulled low. Thus N416 fulfills the function of one of the transistors 244 in FIG. 2, and quickly pulls a section of the delay line low. Assuming P412 is activated, the operation of the rest of inverter 410 is as follows. When IN302 is a logic low, the gates of P414 and N416 will both be pulled low, causing N416 to be deactivated, and P414 to be activated. Thus, S432 will be pulled high, resulting in an output of a logic high. Conversely, when IN302 is a logic high, the gates of P414 and P416 will be pulled high, deactivating P414, and activating P416. Thus, S432 will be pulled low, resulting in an output of a logic low.

Inverter 420 operates similarly, but is designed for efficient use of the same signals that drive inverter 410, thus resulting in complimentary operation, as described below. Inverter 420 includes PMOS transistor P422 with the source coupled to V402, and the drain coupled to the drain of NMOS transistor N424. The gates of both P422 and N424 are driven by IN302. Transistors P422 and N424, driven by the input, IN302, can be considered the "inverter portion" of inverter 420, while transistor N426 can be considered the "tristate portion" of inverter 420. The output of inverter 420, S434 to the gate of an associated PMOS delay line transistor, is coupled to the node coupling the drains of P422 and P424 together, and is thus driven by P422 or N424, as discussed below. The source of N424 is coupled to the drain of NMOS transistor N426, which has its source coupled to G308. The gate of N426 is driven by the control bit (one bit of B{3:0}).

Observe the complimentary operation of inverter 420 with respect to the operation of inverter 410. Inverter 420 only acts as a normal inverter (either pulls S434 high or pulls S434 low to invert a received input) when the control bit is a logic high, which activates N426.

Thus, when the control bit is a logic high, N426 is activated, and S434 is driven by either P422 or N424, depending on the logic value of IN302. When IN302 is a logic high, the gates of P422 and N424 are pulled high, deactivating P422 and activating N424, driving S434 to a logic low. When IN302 is a logic low, the gates of P422 and N424 are pulled low, deactivating N424 and activating P422, driving S434 to a logic high. When the control bit is a logic low, then output S434 is high impedance for high inputs, and a logic high for low inputs.

Note that tristate inverters 410 and 420 provide efficient designs to implement combined slew rate control and crowbar control. That is, crowbar control could be implemented with a transistor coupled to the gate of an output transistor, as illustrated in FIG. 2, and an inverter could be used to provide selective driving of an output transistor as illustrated in FIG. 3. However, a typical fully tristatable inverter requires four transistors, and the crowbar current would require an additional transistor, for a total of five transistors to implement the two functions. However, tristate inverters 410 and 420, which may be referred to as "half-tristate inverters," each require only three transistors, for a savings of two transistors per instance.

Figure 5:
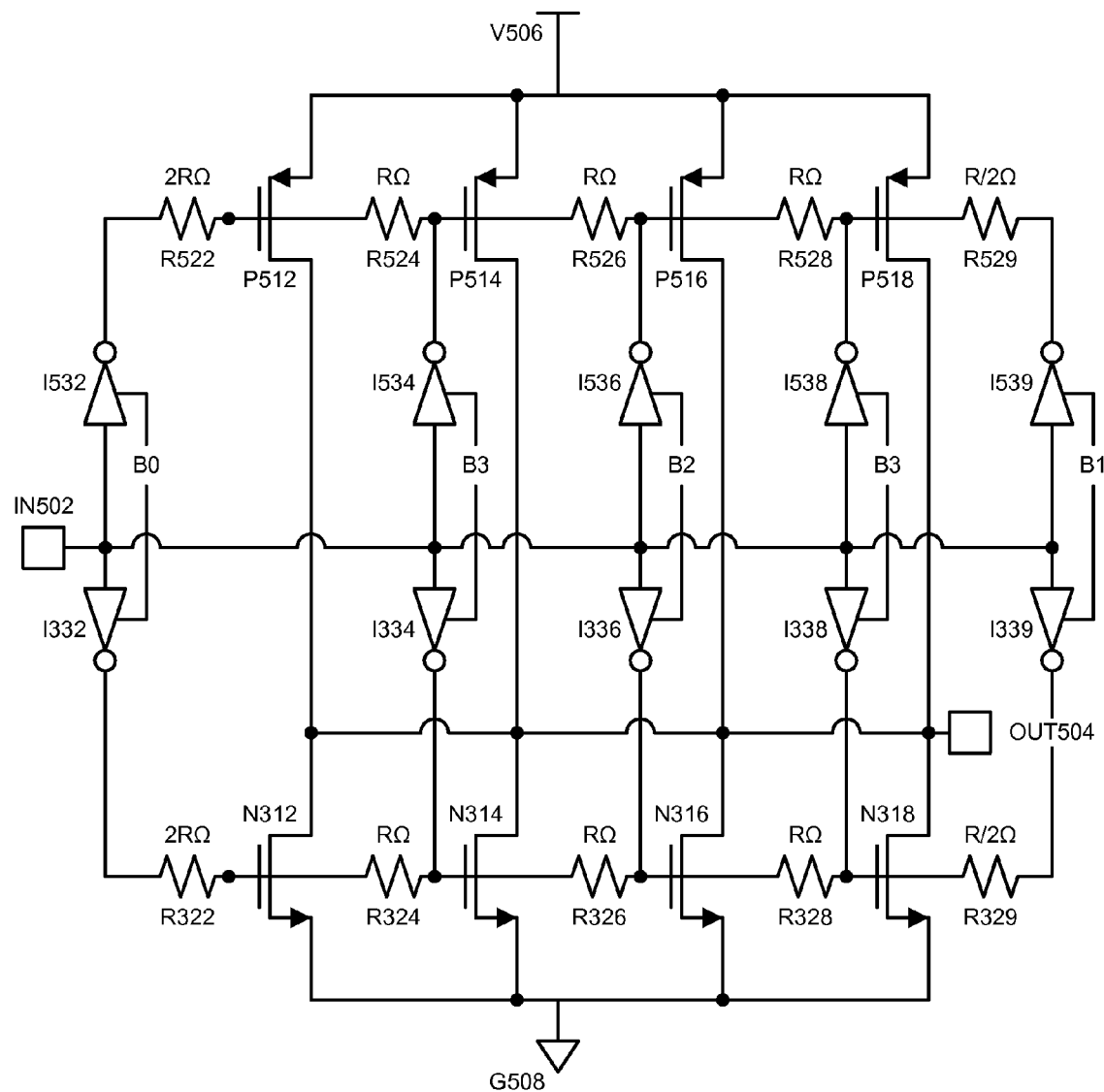
FIG. 5 is a representation of a digital delay line driver having crowbar current control and variable slew rate control.

FIG. 5 is a representation of a digital delay line driver having crowbar current control and variable slew rate control. Circuit 500 illustrates both NMOS and PMOS portions of a digital delay line driver, with crowbar current control, and variable slew rate control. Given the number of elements in circuit 500, the primary output path is highlighted with bolder lines. As the bold lines show, the basic output path showing the delay line driver is enhanced with slew rate control based on the inverters that selectively drive the output path, and the crowbar current control, which can limit shoot through caused by both NMOS and PMOS output transistors being concurrently activated.

The NMOS portion of circuit 500 is described with respect to FIG. 3. The NMOS portion is combined with the active turn off elements described with respect to FIG. 2, for example, by use of inverter 410 of FIG. 4A. Thus, each inverter in the NMOS portion or the NMOS delay line of circuit 500, I332, I334, I336, I338, and I339, can be an instance of inverter 410 of FIG. 4A. In the PMOS portion or PMOS delay line, each inverter I532, I534, I536, I538, and I539, can be an instance of inverter 420 of FIG. 4B. Note that although the same control bits are shown driving I332, I334, I336, I338, and I339 (the NMOS portion inverters) as well as I532, I534, I536, I538, and I539 (the PMOS portion inverters), it will be understood that in practice the control signals from the control bits driving the NMOS portion inverters would be inverted relative to control signals to the PMOS portion inverters. The logic to invert the control signals is understood by those skilled in the art, and is left out of circuit 500 for purposes of simplicity in the diagram and simplicity in description.

Input IN502 determines how output line OUT504 is driven by the NMOS and PMOS sections of circuit 500. Ground G508 may be the same or different as grounds discussed above, just as voltage source V506 could be the same or different as voltage sources discussed above. As the NMOS portion is previously described, the corresponding components of the PMOS portion will be briefly discussed. The PMOS portion includes output transistors P512, P514, P516, and P518. Resistors R522, R524, R526, R528, and R529 having values of 2R Ω, R Ω, R Ω, R Ω, and R/2Ω, respectively, are configured similarly to resistors R322, R324, R326, R328, and R329.

In one embodiment, crowbar current control is provided by elements I332, I334, I336, I338, and I339, in the NMOS portion, and with I532, I534, I536, I538, and I539 in the PMOS portion of circuit 500. When IN502 is a logic high, it drives the gates of the PMOS elements high, deactivating the PMOS pull up elements of the inverters, enabling the PMOS delay line to drive the output line OUT504, while concurrently driving the NMOS pull down elements of the inverters to an active state, shutting off the NMOS delay line. When IN502 is a logic low, it drives the gates of the PMOS pull up elements of the inverters low, activating them, and shutting off, or deactivating the PMOS delay line, while concurrently driving the NMOS pull down elements of the inverters to a deactivated state, enabling the NMOS delay line to drive output line OUT504.

Slew rate control is provided in the NMOS delay line as discussed above. The control bits, B[3:0] drive I534 and I538, I536, I539, and I532, respectively, as well as corresponding inverters I334 and I338, I336, I339, and I332, respectively, of the NMOS portion of circuit 500. The control bits have a similar effect on the PMOS portion of circuit 500 to what is described in FIG. 3 with respect to the NMOS portion. Activating the inverters and driving the delay line portions of the circuit 500 may be referred to as setting a slew rate control signal, or simply a control signal, which selectively drives delay line transistors based on the control bits, B[3:0].

Control logic can refer to either or both of the inverters that are responsive to the control bits (the slew rate control elements) and/or the crowbar control elements. In one embodiment, as illustrated, the same inverter can provide both control features for a particular transistor of a delay line. However, control logic could separately refer to slew rate control elements and crowbar control elements, where each may be separate control logic.

Figure 6:
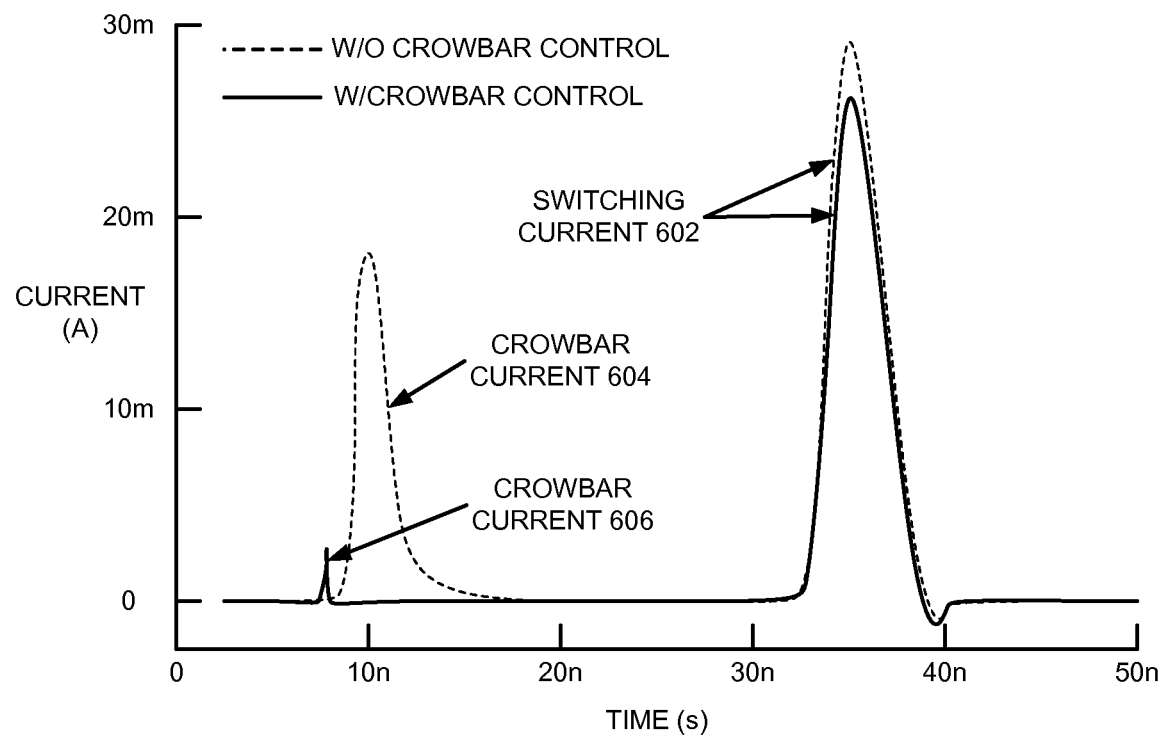
FIG. 6 is a representation of a simulation result for crowbar current reduction.

FIG. 6 is a representation of a simulation result for crowbar current reduction. The simulation representation illustrates the transient output current of all NMOS output transistors in an NMOS portion of a digital delay line driver during an input edge transition that causes the NMOS output transistors to activate. In the example of FIG. 5, the NMOS output transistors will activate at a falling edge of the input signal, causing the NMOS portion to pull the output line low. The individual currents of each output transistor in the delay line are added together to get the total current shown in FIG. 6.

The dashed graph shows a reference point of a digital delay line driver without the crowbar current control described herein (such as that shown in FIG. 1). Around the 10 nanosecond mark, a current spike of nearly 20 milliamps is observed, followed by a later spike of nearly 30 milliamps is seen at approximately 35 nanoseconds. The first spike corresponds to a rising edge of the input signal, which should activate only the PMOS transistors. However, a current spike is seen in the NMOS transistors due to shoot through, given the NMOS delay line will not have completely shut down prior to the PMOS transistors turning on. All shoot through current in the 10 nanosecond spike is wasted. The second current spike is the falling edge, which is where the NMOS delay line should activate, corresponding to an expected current spike that performs the useful work of pulling the output line low.

The solid line illustrates a simulation result with the crowbar control circuitry activated. Again considering the circuit of FIG. 5, the rising edge at approximately 10 nanoseconds should correspond to the NMOS transistors being deactivated or shut off, and only the PMOS transistors should be activated and conducting current. Observe that there is a minimal spike in the NMOS current in the solid line curve, which is much closer to the ideal than the traditional response illustrated by the dashed line curve. Again, the second spike corresponds to the falling edge. Note that there may be a slight reduction in current amplitude with the NMOS crowbar current controlled circuit. However, such a reduction can be designed for.

Figure 7:
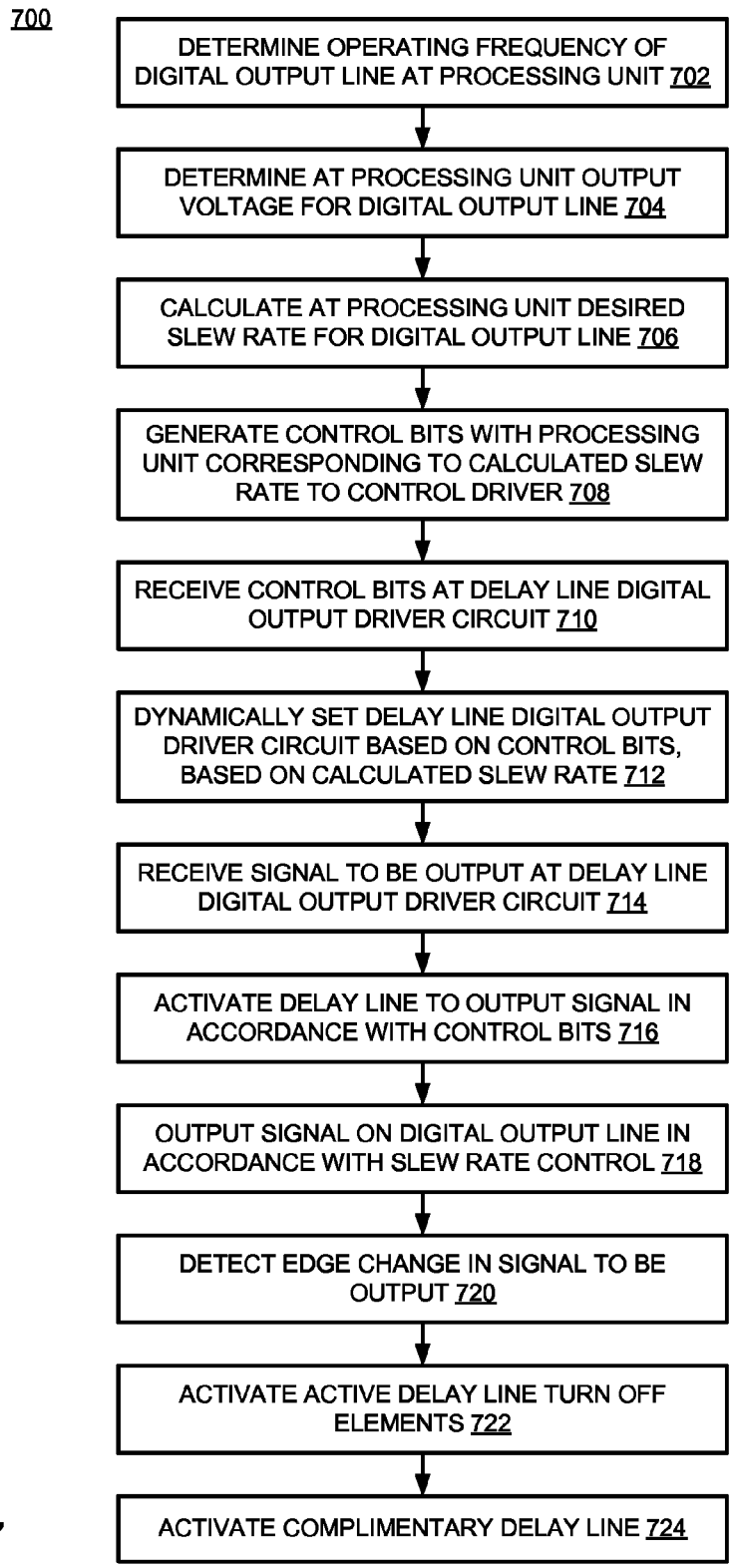
FIG. 7 is a flow diagram of an embodiment of a process for operating a circuit having variable slew rate control.

FIG. 7 is a flow diagram of an embodiment of a process for operating a circuit having variable slew rate control. Flow diagrams as illustrated herein provide examples of sequences of various process actions. Although shown in a particular sequence or order, unless otherwise specified, the order of the actions can be modified. Thus, the illustrated implementations should be understood only as an example, and the process can be performed in a different order, and some actions may be performed in parallel. Additionally, one or more actions can be omitted in various embodiments of the invention; thus, not all actions are required in every implementation. Other process flows are possible.

Flow 700 includes operations (702, 704, 706, 708) that may be performed at a processing unit or other control/management unit of a microchip (e.g., microcontroller, microprocessor, ASIC (application specific integrated circuit), etc.), and other operations that are performed at a delay line driver circuit. In one embodiment, a processing unit determines an operating frequency of a digital output line, 702. The operating frequency may be constant, or may change over the course of operation of the digital output line. The processing unit may determine an output voltage for the digital output line, 704. The output voltage may be equal to or less than a microchip reference voltage (Vcc, or voltage source). The voltage level of the output voltage may affect how the delay line driver can drive the line, and thus what slew rate will be used. Generally, the determination of the voltage level is a design-time decision on the part of the microchip designer, and can be assumed.

The processing unit calculates the desired slew rate for the digital output line, 706. In one embodiment, based on the desired slew rate, the processing unit may also generate control bits corresponding to the calculated slew rate to control the output driver, 708. As described above with reference to FIG. 5, for example, the delay line digital output driver circuit can include a number of control elements operated by control bits to drive the delay line of the delay line digital output driver. In one embodiment, the value of the control signal (as represented by the control bits) may be constrained to be one of only a few selections (e.g., one of three ways to drive the circuit). The value may be constrained even if there are enough bits of control signal resolution to represent many more values (e.g., eight total ways, but only three are allowed to be selected). Alternatively, the design of the system may allow for more flexibility in the slew rate control, and allow up to all possible combinations as valid selections.

The delay line digital output driver circuit receives the control bits, 710, from the processing or control unit. Via the processing unit and the generation of the control bits, user control may be allowed. For example, certain pins of a microchip may allow a user-generated selection of the slew rate. The control bits may dynamically set the delay line digital output driver circuit to output a signal at the calculated slew rate, 712. Thus, the control bits may be considered to configure the delay line digital output driver circuit or its component parts.

The delay line digital output driver circuit receives a signal to be output on the output line, 714. The signal may be output exactly as received, or it may be inverted. In one embodiment, the signal input to the delay line digital output driver circuit is adjusted to be inverted, based on knowledge of the configuration of the delay line digital output driver circuit. The control bits and the received signal activate the delay line to output the signal (or its inverse) in accordance with the control bits, and thus in accordance with the desired slew rate, 716. The activated circuit thus outputs the signal on the digital output line in accordance with the slew rate control, 718.

In one embodiment, the delay line digital output driver circuit detects an edge change in the signal to be output, 720. Such detection may be as simple as receiving the signal at the delay line digital output driver circuit, which then has circuitry activate and/or deactivate in response to the change. Alternatively, such detection may be performed by a processing unit, which can, for example, indicate the change to the delay line digital output driver circuit. In one embodiment, the edge change (e.g., a rising edge or a falling edge) activates active delay line turn off elements that operate to shut off the transistors of the delay line in a substantially simultaneous fashion, 722. Note that a delay line digital output driver generally includes circuitry, or one portion, to pull down the digital output line, and circuitry, or a second portion, to pull up the digital output line. Thus, complimentary delay line circuits may be present in the delay line digital output driver circuit. Operation of one delay line may be performed at opposite times with the complimentary delay line. Thus, shutting off one delay line is generally followed by activating the complimentary delay line, 724.

Various operations or functions are described herein, which may be described or defined as software code, instructions, configuration, and/or data. The content may be directly executable ("object" or "executable" form), source code, or difference code ("delta" or "patch" code). The software content of the embodiments described herein may be provided via an article of manufacture with the content stored thereon, or via a method of operating a communications interface to send data via the communications interface. A machine readable medium may cause a machine to perform the functions or operations described, and includes any mechanism that provides (i.e., stores and/or transmits) information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content.

Various components described herein may be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications may be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A digital driver, comprising:
   a delay line to provide adjustable transition control for an output signal, the delay line having multiple n-type transistors coupled in parallel to drive a digital output line low, wherein each transistor has an output terminal, a control terminal, and a reference terminal, wherein the output terminals are coupled to an output node to generate the output signal at the output node, and wherein the control terminals are coupled together to be activated in response to an input signal;
   control logic coupled to the control terminals of the multiple transistors of the delay line, the control logic to generate signals at selective control terminals in response to digital control bits to selectively drive the multiple transistors of the delay line at one or more selected points in the delay line in response to the signal, according to the digital control bits, to dynamically adjust a slew rate for the digital driver;

a second delay line having multiple p-type transistors coupled in parallel, wherein each p-type transistor has an output terminal, a control terminal, and a reference terminal, wherein the output terminals are coupled to the output node to generate an output signal to drive the digital output line high in response to the input signal, and wherein the control terminals are coupled together to be activated in response to the input signal; and p-type control logic coupled to the control terminals of the multiple p-type transistors, the p-type control logic to generate signals at selective control terminals in response to the digital control bits to selectively drive the multiple p-type transistors of the second delay line at one or more selected points in the second delay line in response to the input signal, according to the digital control bits, to dynamically adjust a slew rate on the output signal for transitions to a logic high on the output line, wherein the p-type control logic comprises half tristate inverters controlled by the digital control bits, each half tristate inverter including:

a tristate portion activated by one of the control bits to place the half tristate inverter in a high impedance state when the one control bit is a logic low, and drive the control terminal of the coupled transistor of the delay line when the one control bit is a logic high; and an inverter portion activated by the input signal to deactivate the coupled transistor of the delay line when the input signal in a logic low.

2. The digital driver of claim 1, wherein the control terminals of the multiple transistors of the delay line are coupled in series via resistors of varying size to affect how the control logic selectively drives the multiple transistors.

3. The digital driver of claim 1, wherein the control logic drives multiple points in the delay line to simultaneously drive multiple transistors of the delay line to decrease a transition time of the output signal.

4. The digital driver of claim 1, wherein the control logic drives the delay line at a beginning, end, or middle of the delay line, or a combination.

5. The digital driver of claim 1, wherein the tristate portion comprises a single transistor whose control terminal is driven by the one control bit, and wherein the inverter portion comprises two complementary transistors whose control terminals are driven by the input signal, and where a node at the output terminals of the complementary transistors is the inverter output.

6. A method comprising:
receiving an input signal at an NMOS delay line circuit, the NMOS delay line circuit having multiple NMOS transistors coupled in parallel to pull down a digital output line to generate a logic low on the digital output line, wherein each transistor has an output terminal, a control terminal, and a reference terminal, wherein the output terminals are coupled to an output node to generate an output signal at the output node, and wherein the control terminals are coupled to the input signal;

receiving digital control bits that dynamically set a slew rate for the delay line circuit;

selectively setting signals with control logic elements coupled to the control terminals in response to the digital controls bits to selectively drive control terminals of the multiple parallel NMOS transistors of the delay line circuit to adjust a turn on time of the multiple parallel transistors relative to each other to control a transition time of the digital output line to provide a dynamically adjustable slew rate on the output signal, wherein selectively setting the signals includes selectively driving one or more selected control terminals of the multiple parallel NMOS transistors in response to the control bits, wherein selectively driving the one or more selected control terminals of the multiple parallel NMOS transistors comprises:

driving the NMOS delay line digital driver circuit with multiple half tristate inverters, at least one half tristate inverter coupled to a gate of each of the multiple NMOS transistors of the NMOS delay line, wherein driving the NMOS delay line with the half tristate inverters includes, for each half tristate inverter, deactivating the coupled gate with an inverter portion for each half tristate inverter when the input signal is a logic high; and placing the half tristate inverter in a high impedance state when a respective digital control bit is a logic high, and activating the half tristate inverter to drive the coupled gate when the respective control bit is a logic low; and driving the digital output line with the delay line circuit in response to receiving the input signal, in accordance with the digital control bits.

7. A method comprising:
receiving an input signal at a PMOS delay line circuit, the delay line circuit having multiple PMOS transistors coupled in parallel to pull up a digital output line to generate a logic high on the digital output line, wherein each transistor has an output terminal, a control terminal, and a reference terminal, wherein the output terminals are coupled to an output node to generate an output signal at the output node, and wherein the control terminals are coupled to the input signal;

receiving digital control bits that dynamically set a slew rate for the delay line circuit;

selectively setting signals with control logic elements coupled to the control terminals in response to the digital controls bits to selectively drive control terminals of the multiple parallel PMOS transistors of the delay line circuit to adjust a turn on time of the multiple parallel transistors relative to each other to control a transition time of the digital output line to provide a dynamically adjustable slew rate on the output signal, wherein selectively setting the signals includes selectively driving one or more selected control terminals of the multiple parallel PMOS transistors in response to the control bits, wherein selectively driving the one or more selected control terminals of the multiple parallel PMOS transistors comprises:

driving the PMOS delay line digital driver circuit with multiple half tristate inverters, at least one half tristate inverter coupled to a gate of each of the multiple PMOS transistors of the PMOS delay line, wherein driving the PMOS delay line with the half tristate inverters includes, for each half tristate inverter, deactivating the coupled gate with an inverter portion of the half tristate inverter when the input signal is a logic low; and;

placing the half tristate inverter in a high impedance state when a respective digital control bit is a logic low, and activating the half tristate inverter to drive the coupled gate when the respective control bit is a logic high; and driving the digital output line with the delay line circuit in response to receiving the input signal, in accordance with the digital control bits.

8. A digital driver, comprising:

a delay line to provide adjustable transition control for an output signal, the delay line having multiple transistors coupled in parallel, wherein each transistor has an output terminal, a control terminal, and a reference terminal, wherein the output terminals are coupled to an output node to generate the output signal at the output node, and wherein the control terminals are coupled together to be activated in response to an input signal; and control logic coupled to the control terminals of the multiple transistors of the delay line, the control logic to generate signals at selective control terminals in response to digital control bits to selectively drive the multiple transistors of the delay line at one or more selected points in the delay line in response to the signal, according to the digital control bits, to dynamically adjust a slew rate for the digital driver, wherein the control logic comprises half tristate inverters controlled by the control bits, each half tristate inverter controlled by a respective control bit, each half tristate inverter including:

a tristate portion activated by a respective control bit to place the half tristate inverter in a high impedance state when the respective control bit is a logic high, and drive the control terminal of the coupled transistor of the delay line when the respective control bit is a logic low; and an inverter portion activated by the input signal to deactivate the coupled transistor of the delay line when the input signal in a logic high.

9. The digital driver of claim 8, wherein the tristate portion comprises a single transistor whose control terminal is driven by a respective control bit, and wherein the inverter portion comprises two complementary transistors whose control terminals are driven by the input signal, and where a node at the output terminals of the complementary transistors is the inverter output.

* * * * *